United States Patent [19]

Lee et al.

[11] Patent Number: 4,568,234
[45] Date of Patent: Feb. 4, 1986

[54] WAFER TRANSFER APPARATUS

[75] Inventors: Steven N. Lee; Jae Y. Kim, both of Irvine, Calif.

[73] Assignee: ASQ Boats, Inc., Tustin, Calif.

[21] Appl. No.: 496,832

[22] Filed: May 23, 1983

[51] Int. Cl.⁴ .............................................. B65G 65/30
[52] U.S. Cl. .................... 414/404; 294/87.1; 414/416; 414/417; 414/751; 414/786
[58] Field of Search ............... 414/217, 222, 403, 404, 414/405, 416, 417, 751; 294/87 R

[56] References Cited

U.S. PATENT DOCUMENTS

| | | | |
|---|---|---|---|
| 4,023,691 | 5/1977 | Perel | 414/403 X |
| 4,311,427 | 1/1982 | Coad et al. | 414/417 |
| 4,457,661 | 7/1984 | Flint et al. | 414/404 |
| 4,466,766 | 8/1984 | Geren et al. | 414/404 |

Primary Examiner—Robert G. Sheridan

Attorney, Agent, or Firm—Knobbe, Martens, Olson & Bear

[57] ABSTRACT

An automated system lifts a batch of semiconductor wafers from a slotted carrier, transfers them laterally and lowers them into a second slotted carrier. In doing this, jaws on the lifting apparatus open automatically to receive or release the wafers. With a carrier having relatively high slotted sides, such as the commonly used plastic cassette, a pusher engages the lower edge of the wafers exposed through the bottom of the cassette and pushes them upwardly sufficiently far to permit the lifter jaws to receive and lift the wafers. The apparatus is oriented at a slight angle to insure that the wafers are all arranged in precise, spaced, parallel relation so as to cooperate with slots in the lifter jaws and slots in the receiving carrier. The system has the capability to move two batches of 25 wafers to a quartz boat having 50 more-closely spaced slots, and similarly, two batches from a quartz boat may be transferred to two different plastic cassettes.

17 Claims, 12 Drawing Figures

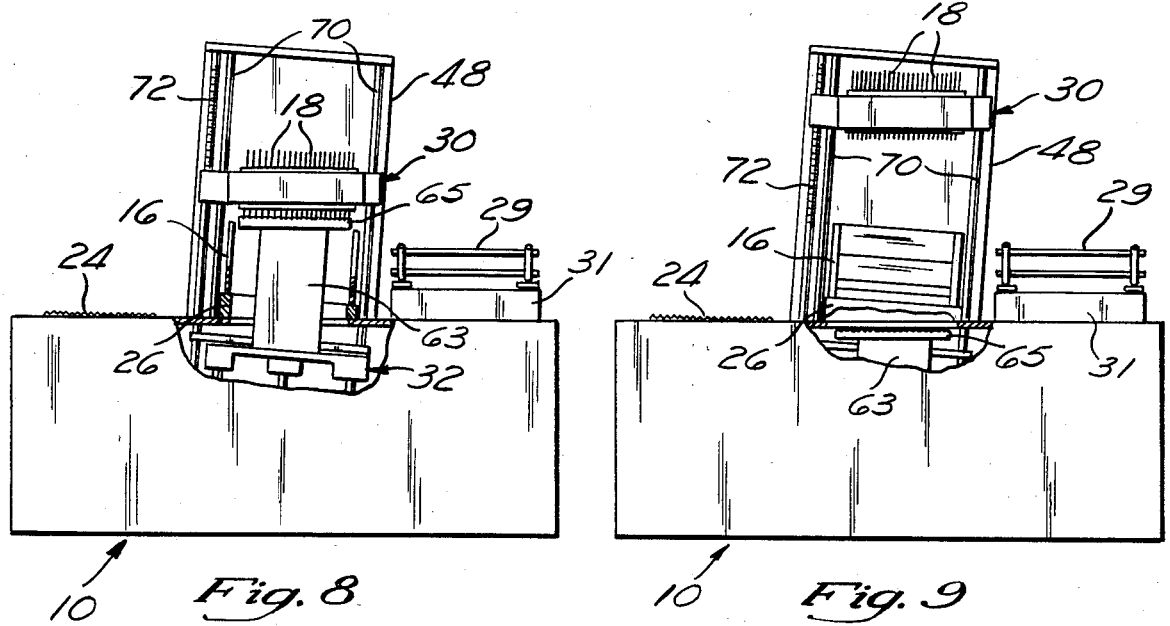
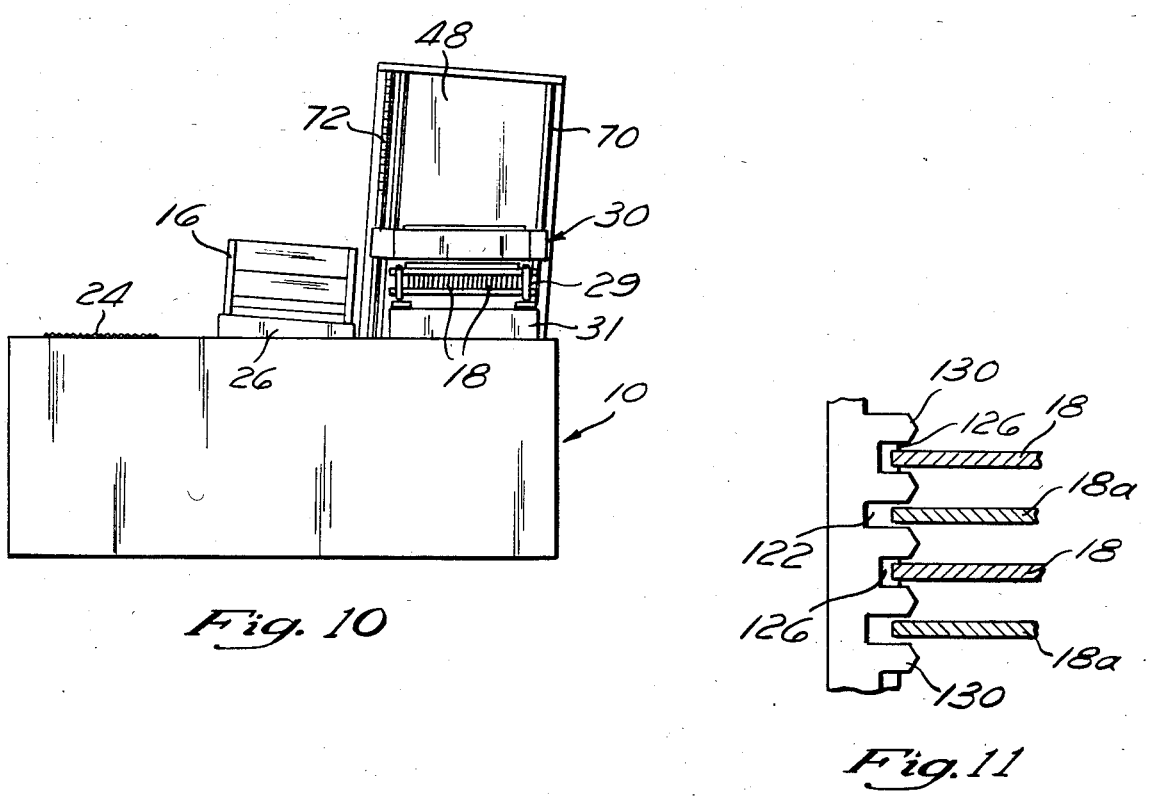

WAFER TRANSFER APPARATUS

BACKGROUND OF THE INVENTION

This invention relates to apparatus for automatically handling batches of small disk-like elements, such as semiconductor wafers, and is more particularly directed to a system for transferring a batch of wafers between one slotted carrier to another slotted carrier.

In the processing of semiconductor wafers to make semiconductor devices, the wafers are subjected to a myriad of processing steps. It is practical to perform many of these steps on a batch of wafers positioned in a carrier having a plurality of spaced slots for receiving the wafers in edgewise, coaxial relation with the wafers spaced from each other. Many of these steps may be performed in a carrier or cassette made of plastic, which is relatively inexpensive and easy to work with. However, other steps must be performed at high temperatures, such as in a heat treating furnace, at temperatures that cannot be tolerated by the plastic cassette. Consequently, it is common practice to transfer the wafers from a plastic cassette to a carrier made of quartz, often referred to as a boat. Also, it is sometimes desirable to transfer the wafers from the quartz boat back to the plastic cassette.

The wafers can, of course, be manually transferred, but this is a delicate, tedious process, perhaps requiring the use of a tweezers, with the result that the delicate wafers are often damaged or contaminated through handling. If the damage is immediately detected, this is a serious loss simply because of the cost of the partially processed wafers. If the damage or contamination is not detected until later, in the form of an unacceptable end product or system in which the product is used, the loss is greatly amplified.

As an attempt to improve the method of handling wafers, the open side of a plastic cassette may be mated with the open side of a quartz boat with the slots of one being carefully aligned with the slots of the other and the wafers then being transferred by pushing the wafers into the boat slots and then inverting the carriers. This approach also has the disadvantage of being a somewhat difficult operation that can result in damage to the delicate and expensive wafers.

One of the difficulties of attempting to transfer batches of wafers from one carrier to another carrier is that the width of the vertical slots in some cassettes is such that the wafers can tilt randomly and are not spaced uniformly or are not precisely parallel. Wide spaces are desired for ease of inserting or withdrawing wafers; which makes the tilting problem more difficult.

In yet another approach, individual wafers have been automatically transferred one by one from one carrier to another. This system is, of course, also very time-consuming. Other automated systems have been attempted; however, all leave something to be desired.

Accordingly, a need exists for an improved automated wafer transfer apparatus with which a batch of wafers may be safely but efficiently transferred.

SUMMARY OF THE INVENTION

In accordance with the present invention, a system is provided wherein a batch of wafers are automatically pushed upwardly from being positioned in a first carrier, such as a plastic cassette, while the wafers are received and lifted as a group by a lifter assembly, preferably including lifter jaws having a plurality of slots for receiving the wafers. The lifter assembly is then moved laterally to be aligned with the slots of a second carrier, such as a quartz boat, and the batch of wafers is lowered into the slots of the quartz boat and released. The operation is reversed to transfer wafers from the quartz boat to the plastic cassette.

In a preferred form of the invention, the plastic cassette filled with wafers is positioned at a slight angle with respect to horizontal. This tilts all the wafers in the same direction so that they are precisely located. By moving the pusher and lifter assemblies in a direction parallel to the faces of the angled wafers, they can be maintained in precise alignment. With a quartz boat having angled slots of the same angle as the cassette tilt angle, the quartz boat may be horizontally positioned. With a quartz boat having vertical slots, the boat can be tilted like the plastic cassette to obtain the desired relation with the transfer apparatus.

In another mode of the automated system, two batches of wafers may be sequentially transferred to or from two different plastic cassettes to a single quartz boat of greater capacity in a two-step process. The lifter assembly jaws are specially formed to facilitate such operation.

The steps of the various sequential operations are automatically controlled such that manual assistance is not required except for initiating the operations.

Further, the system is designed so as to handle the wafers in a manner to prevent damage, including the delicate step of lifting and releasing a batch of wafers. Preferably, the lifter assembly includes a pair of elongated arms or jaws that are spring-biased into a closed position and mechanically locked by a linkage arrangement, with a motor being provided to move the jaws to the open position.

DETAILED DESCRIPTION OF A PREFERRED EMBODIMENT OF THE INVENTION

FIGS. 8, 9, and 10 are a series of elevational, schematic views illustrating the steps of transferring a batch of wafers from a first carrier to a second; and FIG. 11 is a fragmentary plan view of the lifter jaw slots when used for transferring sequentially two batches of wafers.

Figure 1:
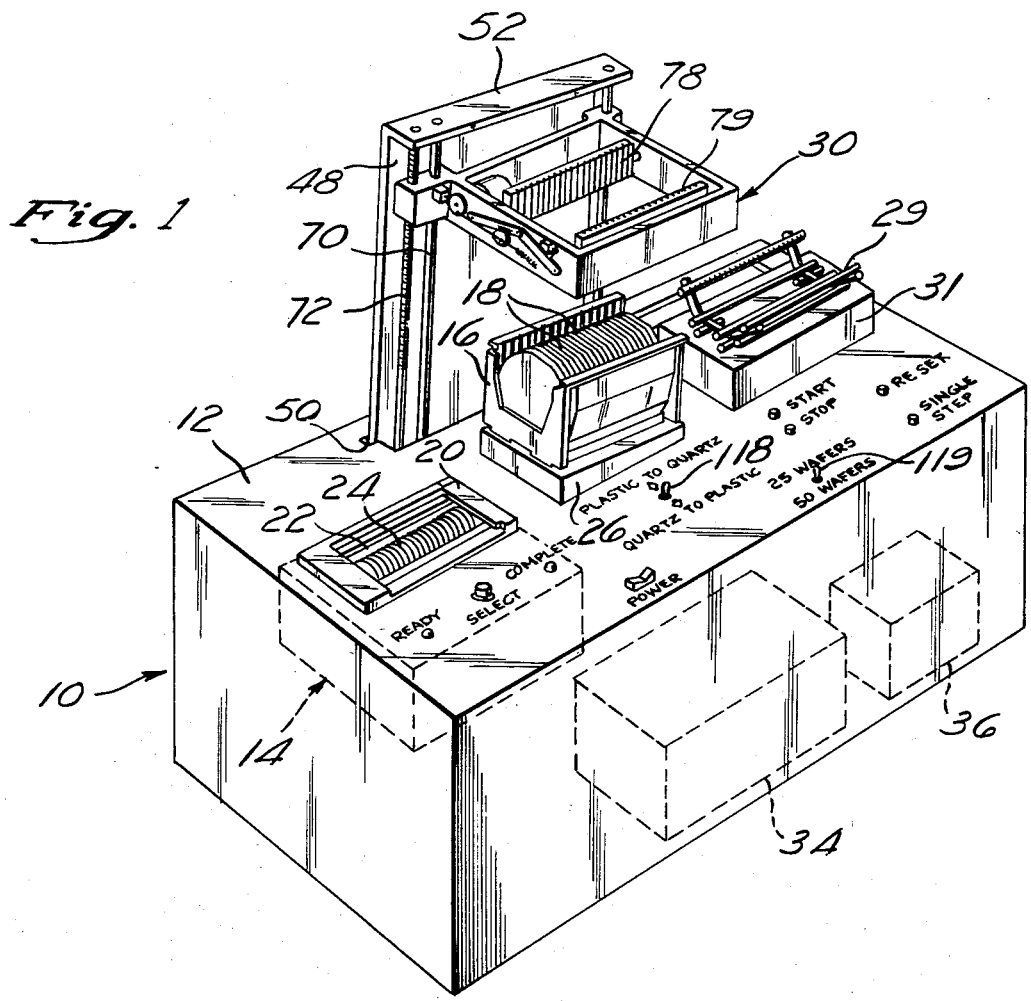
FIG. 1 is a perspective view of the apparatus of the invention, illustrating the upper surface of a support housing and the apparatus mounted thereon.

Referring to FIG. 1, the transfer apparatus of the invention can be seen to include a generally box-like housing 10 having a top wall 12 that forms a support surface during operation of the apparatus. Positioned on the left side of the top wall 12, partially supported on the upper surface and partially suspended from the top wall, is an appliance 14 for automatically orienting flat edges on a batch of semiconductor wafers carried in a carrier or cassette. An example of such a cassette is indicated at 16 in the center of the top wall 12 carrying a batch of semiconductor wafers 18. The cassette is of standard construction, typically made of plastic and provided with sidewall structure having a plurality of inwardly extending ribs defining a series of slots into which the semiconductor wafers are positioned so as to support the wafers in edgewise, coaxial, spaced, roughly parallel relation. As may be seen, the upper end of the cassette is open to facilitate the insertion and removal of wafers. Also, the structures extend only partially into the bottom wall area, leaving an open slot in the bottom wall.

Each wafer is typically provided with a major flat area on its edge that provides information regarding the crystal orientation of the semiconductor material, and it is desirable in many wafer fabrication operations that the wafers in a given cassette be uniformly oriented. The appliance 14 will automatically orient the flats on the cassette of wafers in a uniform manner. The appliance includes a cassette positioning fixture 20 which is shown positioned on the upper surface of the wall 12 surrounding a slot 22 in the wall 12. The bottom edges of the wafers are accessible through this slot when the cassette of wafers is positioned on the fixture 20. Suspended from the top wall 12 is means for rotating the wafers to a desired angular orientation. This means includes an elongated, generally cylindrical roller or driver 24, which may be partially seen through the slot in the top wall. The details of the appliance 14 need not be disclosed herein since that appliance does not form a part of the present invention. Also, it need not be attached to the apparatus 10 shown in FIG. 1, but instead could be separately housed. It is included with the apparatus 10 simply because it is convenient to have the orienter located adjacent to the transfer apparatus.

The cassette 16 is shown supported on a cassette positioning fixture 26, which has an opening in the center similar to the fixture 14. In accordance with a major feature of the invention, the cassette is higher on the left end than on the right end, which causes the wafers 18 to all tilt in the same direction so that they are arranged more uniformly in parallel relation. The slots in the cassette 16 are perpendicular with respect to the bottom of the cassette; and thus without tilting the cassette, some wafers may tilt in one direction and others in an opposite direction. Cassettes with narrow slots minimize this problem, but wider slots are desirable because it is easier to insert and remove the wafers from them without damage. The cassette 16 only has to be tilted about 2° to cause the wafers to tilt in one direction; however, this has been exaggerated somewhat in the drawings for illustrative purposes.

Positioned to the right of the fixture 26 is a fixture 31 adapted to receive a second carrier such as a quartz boat having a plurality of slots for receiving semiconductor wafers. The slots are oriented at the same angle as the slots in the cassette 16 when the cassette is positioned on the fixture 13. As mentioned above, many wafer processing steps are performed with the wafers confined in a plastic cassette 16, but other steps, such as those performed in a furnace, require a boat made of quartz that can tolerate the heat involved. Thus the purpose for the apparatus is to transfer wafers from the plastic cassette to the quartz boat or vice versa.

Figure 2:
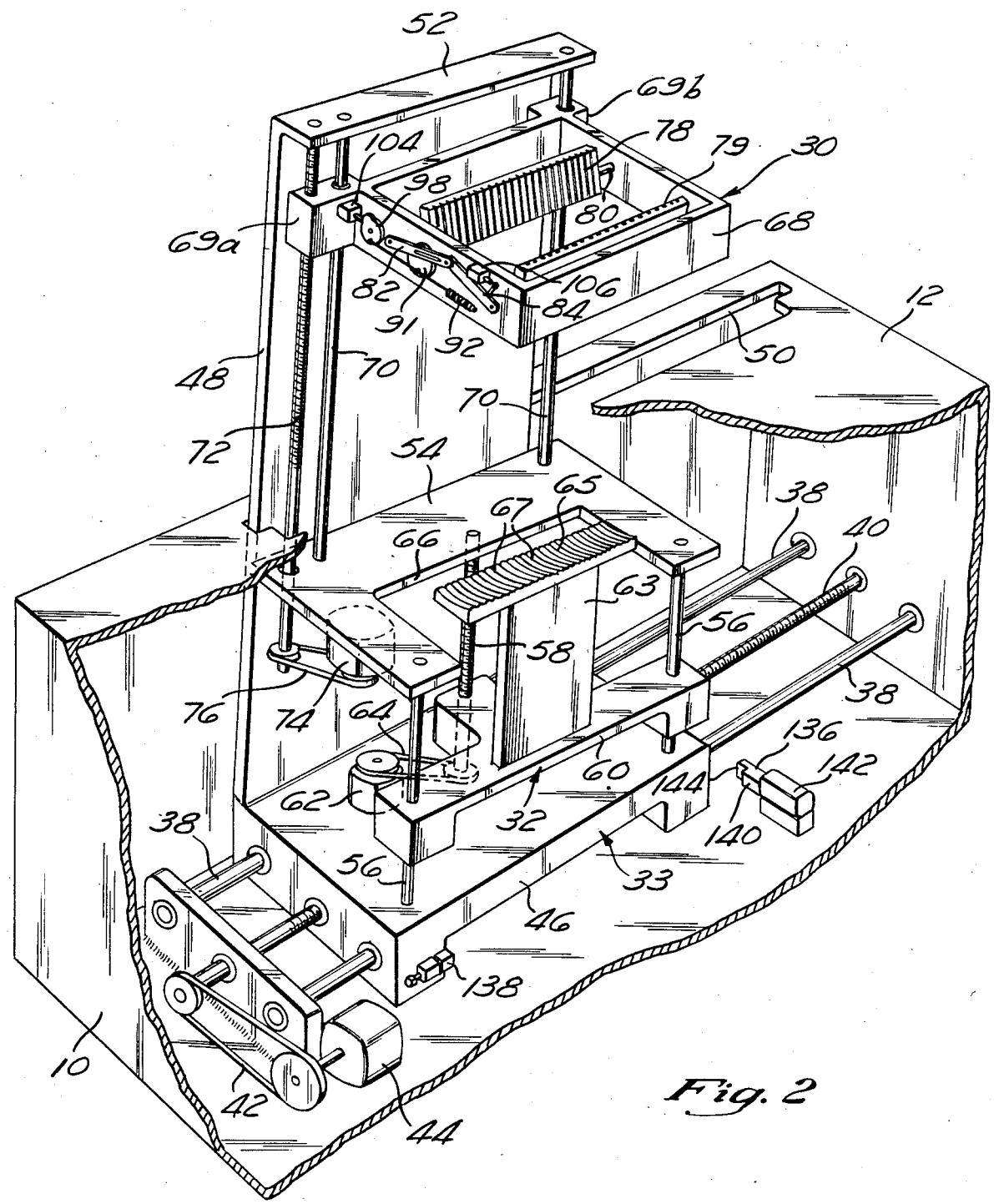
FIG. 2 is a perspective view of the apparatus of FIG. 1 with a portion of the housing cut-away to illustrate the structure for supporting and moving a pusher assembly and a lifter assembly.
Figure 3:
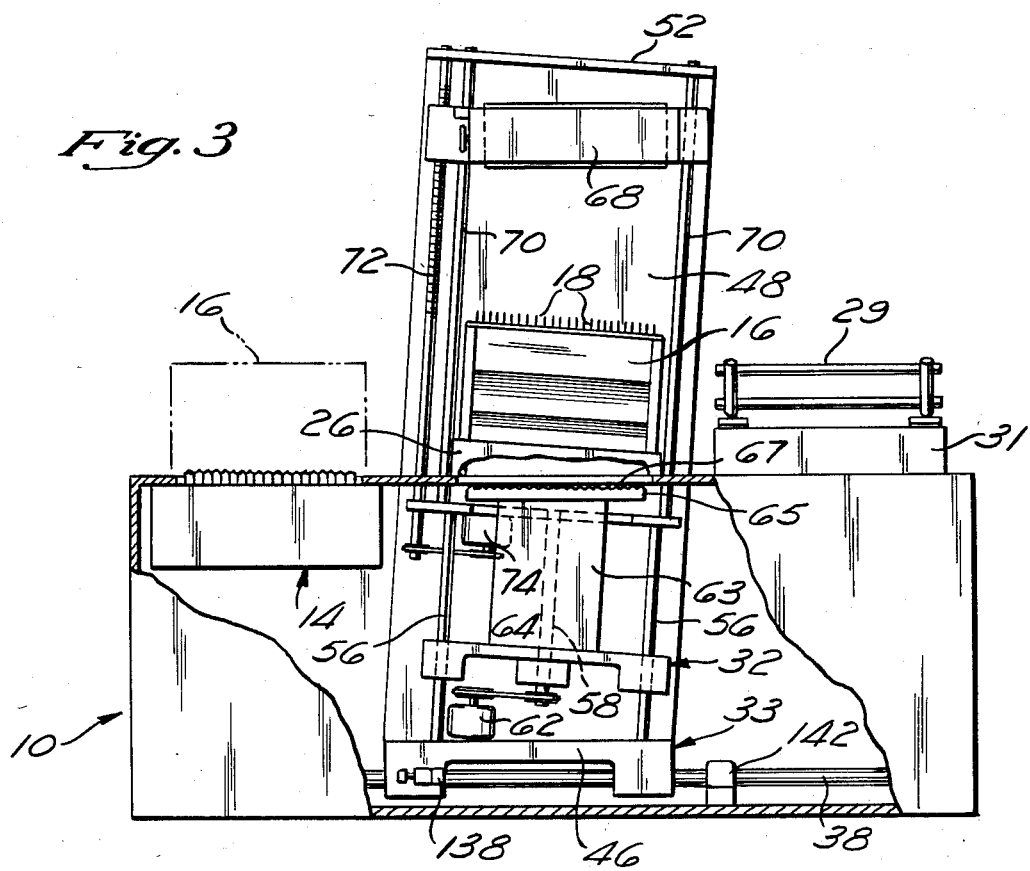
FIG. 3 is a front elevational view of the apparatus of FIG. 1, with part of the housing cut-away to show the overall arrangement of the apparatus of the invention.

Referring to FIGS. 2 and 3 as well as FIG. 1, the other major components of the apparatus include a lifter assembly 30 located above the top wall 12, a pusher assembly 32 located below the wall, a movable support carriage 33 supporting the lifter and pusher, an electronic controller 34, and a power supply 36.

Supported on the bottom wall of the housing 10 is a pair of spaced, parallel, horizontally extending guide rods 38. Positioned between these guide rods in parallel relation to them is a threaded lead screw 40, which is rotated by a belt 42 connected to a motor 44.

The support carriage 33 mounted for transverse movement on the guide rods 38 includes a generally horizontally extending base plate 46 through which the rods 38 slidably extend. Secured to the rear edge of the base plate is a back support plate 48 extending upwardly adjacent the rear of the housing 10 through a transversely extending slot 50 in the housing wall 12, with a generally horizontally extending flange 52 attached to its upper end. A central support plate 54 extends generally horizontally and forwardly from the back plate 48, the central plate 54 being located immediately below the top housing wall 12. The lead screw 40 is threadably received in a tapped hole in the base plate 46 so that rotation of the shaft will move the base plate horizontally together with the back plate 48 and the components mounted thereon. To facilitate movement without lubrication and to minimize the generation of particulates, a threaded plastic nut-like member (not shown) may be mounted to the plate 46 for the connection to the lead screw 40.

Extending upwardly between the base plate 46 and the central plate 54 are a pair of spaced parallel guide rods 56. Also extending between these plates and mounted on suitable bearings is a lead screw 58. The pusher assembly 32 includes a bracket 60 which is slidably mounted on the guide rods 56 and threadably connected to the lead screw 58. A motor 62 and pulley 64 are connected to rotate the lead screw 58. Supported on the bracket 60 is an angled upright 63 having mounted on its upper end a horizontally oriented pusher plate 65, which has a plurality of equally spaced slots 67 formed therein for receiving the lower edges of the wafers 18. The pusher plate 65 is aligned with a cutout 66 in the central plate 54 so that the pusher plate can extend upwardly through the cutout. The plate 65 is also aligned with the opening in the housing top wall 12 beneath the wafers 18 in the cassette 16.

The lifter assembly 30 includes a generally rectangular frame 68 having a pair of corner portions 69a and 69b slidably mounted on a pair of spaced guide rods 70 supported and extending between the central plate 54 and the upper flange 52, the rods extending through the opening 50 in the housing wall 12. A threaded lead screw 72 extends parallel to the guide rods 70, being rotatably mounted and supported by the flange 52 and the central plate 54. The lead screw 72 extends through a threaded portion of corner lug 69a to cause the pusher assembly 30 to slide on the rods 70 when the lead screw 72 is rotated. A suitable motor 74 and belt 76 mounted on the lower surface of the central plate 54 rotate the lead screw 72.

Figure 4:
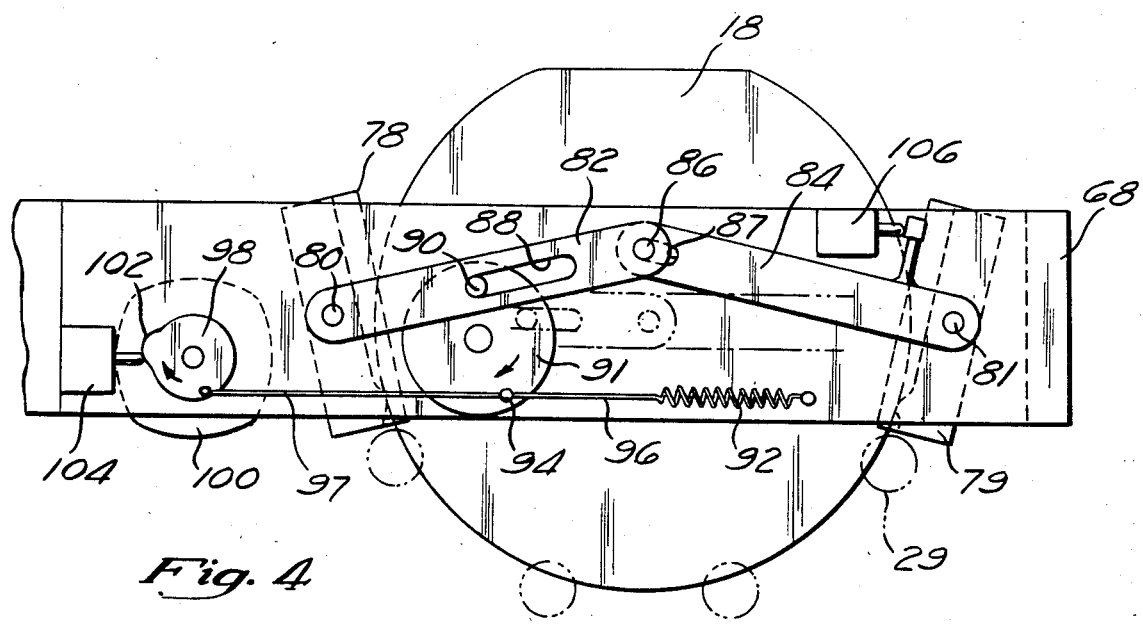
FIG. 4 is a side elevational, somewhat schematic illustration of the lifter assembly.
Figure 5:
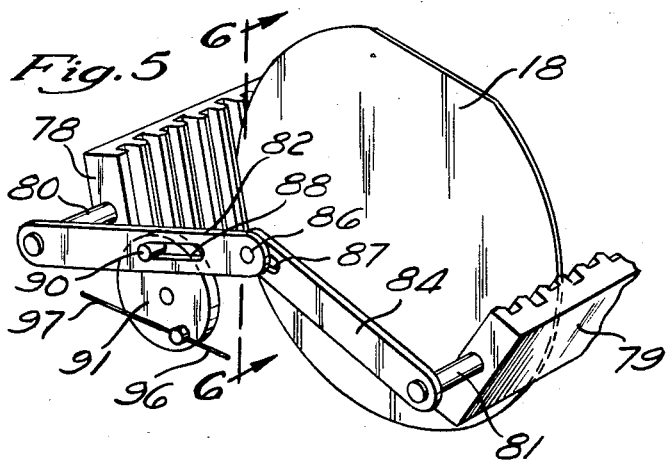
FIG. 5 is an enlarged perspective view of a portion of the lifter assembly.

Referring to FIGS. 2, 4 and 5, the lifter assembly includes a pair of elongated arms or jaws 78 and 79, which are located within the frame 68. The jaws are fixed to shafts or pins 80 and 81 that are rotatably mounted in the side members of the frame in spaced parallel relation. Fixed to the rear jaw pin 80 is an elongated link 82, and fixed to the front jaw pin 81 is a similar link 84. As may be seen, the links 82 and 84 extend towards each other so that that their adjacent ends are in overlapping relation. A connecting pin 86 secured to one of the links extends through a slot 87 or enlarged opening in the other link. Such a connection permits the joined ends of the links to move downwardly as the jaws pivot. An elongated slot 88 formed in the link 82 has positioned therein a pin 90 which is eccentrically mounted on a pulley 91 pivotally mounted on the exterior of the frame 68. A spring 92 is connected at one end to the frame 68 and at its other end to the periphery of the pulley 91 by a cord 96. The connection is at a point 94 adjacent to its periphery, about 180° from the pin 90. Also connected near that location to the pulley 91 is a wire or cord 97, which at its other end is connected to the periphery of a pulley 98 rotated by a reversible motor 100. A cam 102 on the periphery of the pulley 98 cooperates with a switch 104 for assisting in the control of the movement of the lifter jaws 78 and 79. A second switch 106 is mounted on the lifter frame 68 to be actuated by the movement of the link 84.

Consistent with the cassette 16 being tilted, the pusher assembly 32 and the lifter assembly 30 are mounted to be moved at the same angle as that of the wafer tilt. This is accomplished in the arrangement illustrated by positioning the back plate 48 at an angle with respect to vertical, as viewed in FIG. 3. This results in the plate 54 and the flange 52 being slightly angled with respect to horizontal, while the guide rods 56 and 70 and the lead screws 58 and 72 extend parallel to the edge of the angled back plate, and parallel to the wafers. Thus, the pusher and lifter assemblies move at the desired angle.

OPERATION

Further description of the invention may best be had by considering the operation of the apparatus. The movements of the transfer apparatus are controlled by selecting the desired operation using the manual controls mounted on the housing top wall 12. The actual transfer operation is then controlled automatically by the controller 34. One example of a suitable controller is that identified as Industrial Control Module, Model 801, manufactured by Control Technology Corporation of 82 Turnpike Road, Westboro, Mass. 01581. This unit is a microprocessor based 32-step sequencer manufactured as a standard control component. The model is customized to a given application by programming a simple, matrix-type program into PROM memory chips which plug into the module. The Model 801 is a sequential controller designed for machinery which must perform a preprogrammed sequence of events on a repetitive basis. Suitable adjustable time delays and programmable limit switch inputs provide the flexibility to control the transfer sequence. Various limit switches or other sensors (not shown) provide signals to the controller for performing the various operations in the proper sequence.

If it is assumed that it is desired to transfer a set of wafers from a plastic cassette 16 to a slotted quartz boat or carrier 29, the boat is precisely positioned on the alignment fixture 31 that positions the boat horizontally and vertically at the desired location to cooperate with the transfer apparatus. The cassette 16 is likewise carefully positioned on the fixture 26 as illustrated in FIG. 1.

If the wafers 18 each has an orientation flat on its periphery and it is desirable that these slots be oriented uniformly, the cassette 16 will first have been positioned on the fixture 20 for wafer orientation. Assuming power has been applied to the system, the ready lamp shown will be energized. The select knob should be rotated to indicate the desired slot orientation. The transfer apparatus has been set to function properly with the slots being oriented on the top side or some slight angle with respect to the top side position. After the orientation process is completed, the complete lamp will be automatically energized.

An example of a suitable apparatus for orienting the wafers is set forth in copending U.S. patent application, Ser. No. 496,833, filed concurrently with the present application, entitled UNIVERSAL FLAT ORIENTER FOR SEMICONDUCTOR WAFER, assigned to the same assignee as the present application. The oriented cassette load of wafers is then manually moved to the position shown in FIG. 1.

The switch 118 on the top of housing wall 12 is moved to the "plastic to quartz" mode indicating that the wafers are to be transferred from the plastic cassette 16 to the quartz boat 29. The selector switch 119 is moved to the "25 wafer" position, if the quartz boat has slots for receiving only 25 wafers, which is the capacity of the typical plastic cassette. Some quartz boats can handle 50 wafers, and the transfer apparatus can be utilized for filling such boats as well, as will be hereinafter described. The start button is then depressed to initiate the automatic operation of the transfer apparatus from the home position shown in FIG. 3. As a first step, the controller causes the drive motors 62 and 74 to be energized causing rotation of the lead screws 58 and 72. The lead screw 72 will cause the lifter assembly 30 to move downwardly to a position closely adjacent to the cassette 16 and the wafers 18. Note, however, the sides of the cassette 16 enclose the wafers 18 to such an extent that the lifter jaws 78 and 79 cannot engage the edges of the wafers at that stage.

As the lifter frame is moving downwardly, the motor 100 of the lifter assembly is energized causing it to rotate the pulley 98 in a clockwise direction, as viewed in FIG. 4. This applies tension on the cord 96 causing the pulley 91 to move in a clockwise direction against the urging of the spring 29. This applies a downward force on the link 82 by means of the eccentric pin 90 carried by the pulley 91, the pin engaging the lower edge of the slot 88. Since the links 82 and 84 are connected, this causes the link 84 to move downwardly as well, moving both links from the upper position, into a lower position shown by the dotted lines in FIG. 4. The links had been mechanically locked in the upper, jaws "closed" position. This downward movement causes the jaws 78 and 79 to pivot to increase the space between their lower ends into an "open" position to receive the wafers. This movement actuates the limit switch 106 that shuts off power to the motors 100 and tells the controller that the jaws are open. The resistance of the motor gears will hold the jaws in this "open" position.

While the lifter assembly is moving downwardly and the jaws are being opened, the pusher assembly is being driven upwardly by the motor 62 and the lead screw 58. This moves the pusher upright 63 and the pusher plate 65 up through the cutout 66, through the opening in the housing wall 12, and through the open bottom of the cassette 16 to engage the lower edges of the semiconductor wafers 18. The plate 65 has a plurality of equally spaced grooves arranged such that each groove will engage the lower edge of a respective wafer. The pusher assembly pushes the wafers upwardly perpendicular to the axis of the wafers into suitable slots formed in the jaws 78 and 79 as seen in FIG. 8. It should be noted that as the wafers are pushed upwardly, the angled axis of the series of wafers in the cassette is shifted to a horizontal axis. That is, the pusher plate 65 engages the wafers sequentially from right to left as viewed in FIG. 3.

Figure 6:
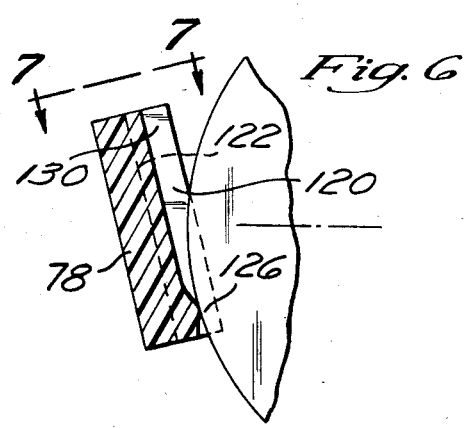
FIGS. 6 and 6a are cross-sectional views on line 6—6a of FIG. 5, illustrating the slots in the lifter jaws and its relation to a wafer.
Figure 7:
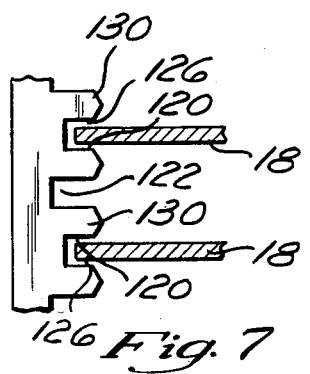
FIG. 7 is a plan view of the slots in the lifter jaws on line 7—7 of FIG. 6.

As seen from FIGS. 6 and 7, the jaws are provided with a plurality of equally spaced ribs 130 with each pair of ribs defining therebetween a series of slots 120 and a series of gaps 122 alternating with the slots 120. The width of each slot 120 and gap 122 is just slightly greater than the width of a respective wafer. As may be seen from FIG. 7, the inner ends of the ribs 130 are pointed or tapered so as to help guide a wafer into its respective slot, if there is any slight misalignment.

Figure 6A:
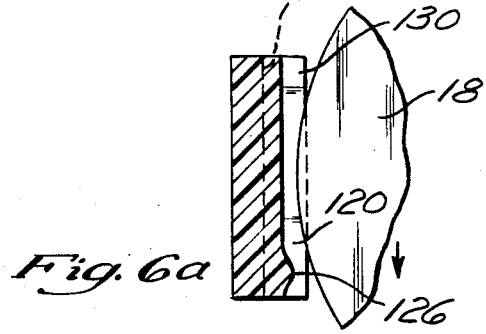

The slots 120 each have an inwardly extending retainer projection or bump 126 as seen in FIGS. 6 and 6a. When the jaws are in their "open" position, as shown in FIG. 6a and broken lines in FIG. 4, the wafers can move upwardly past the bumps 126 to the position shown in FIG. 6a. Once the wafers are properly positioned within the jaws, the controller once more applies power to the gear motor 100 which rotates in a counterclockwise direction to release the tension on the cord 97. This enables the spring 92 through the cord 96 to move the jaws 78 and 79 into a "closed" position shown in FIGS. 6 and 4. In that position, the bumps 126 in the slots are below the upper half of the wafer so that the wafers are captured within the jaws so they can be lifted. This is somewhat akin to a miniature "steam" shovel action.

It should be noted that the slots 120 and the gaps 122 are oriented at an angle the same as the wafers in the cassette 16. The jaws and the frame are horizontally oriented even though they move on the rods 70 at the same angle as the wafers. This means that the slots in the jaws are angled with respect to the jaw shafts.

The spring 92 is sufficiently strong to support the opening force on the jaws provided by the weight of the wafers. This approach has the advantage of a resilient closing force being applied on the jaws such that if a particular wafer happens to be misaligned in the jaws, or there is some other obstruction, the closing force is limited to the preselected force of the spring so as not to damage the wafers. Also, with the jaws having been returned to the closed, position shown in FIG. 4, they are locked into closed position by the location of the eccentric pin 90. That is, it takes a positive rotating force provided by the motor to move the jaws out of their locked position.

As the motor 100 rotates in the counterclockwise direction as viewed in FIG. 4, the cam 102 engages the switch 102 to deenergize the motor. This activation of the switch also indicates to the controller that the jaws are now in position to lift the wafers upwardly. Consequently, the controller directs the wafers to be lifted as a group upwardly further away from the cassette 16, to the position of FIG. 9.

Shortly thereafter, the motor 44 is also energized to cause the movable carriage 33 to be moved laterally, by the lead screw 40 cooperating with the base plate 46. This includes moving the lifter assembly 30 laterally to be aligned above the quartz boat 29. As the structure approaches the position wherein the wafers are aligned with the slots in the quartz boat, the lifter assembly 30 is lowered so that the wafers are gently inserted into the slots of the quartz boat as seen in FIG. 10.

It should be noted that the boat 29 is horizontally oriented but that the relatively wide slots in the boat are angled slightly with respect to vertical as viewed in FIG. 3. This slight angle is the same as the angle that the wafers in the plastic cassette 16 were oriented as a result of the tilting of the cassette. Since the guide rods 70 that support and guide and movement of the lifter assembly are oriented at this slight angle with respect to vertical, the wafers are moved downwardly and enter the quartz boat slots at the desired angle. Note that the sides of the quartz boat are lower than the side structure of the plastic cassette such that the lifter assembly 30 can be lowered sufficiently to place the wafers into the quartz boat. That is, the lifting bumps 126 in the lifter jaws must move below the upper half of the wafers. Note also that the quartz boat is positioned horizontally as are the lifter frame 68 and the jaws 78 and 79. Thus the frame and jaws can be moved close to the top rods of the quartz boat 29, as seen in FIGS. 10 and 4. Also the row of bumps 126 in the series of slots 122 are horizontally oriented so that the axis of the wafers was horizontal when the wafers were lifted by the jaws, as seen in FIGS. 8, 9 and 10 and thus the wafers are gently placed in the boat without being dropped.

The controller 34 simultaneously causes the motor 100 to be energized rotating the lifter jaws from their locked position so as to release the wafers. The lowering of the lifter jaw links 82 and 84 actuates the switch 106 to interrupt the power to the motor 100 and to signal the controller that the jaws have been opened. The controller will then cause the motor 74 to be energized moving the lifter assembly 30 upwardly. At an appropriate point, the controller will also once more energize the motor 100 driving the cam 98 in a counterclockwise direction, allowing the spring 92 to return the jaws to a closed position. The energy to the motor 100 is interrupted, when the cam 102 engages the switch 104.

As the lifter assembly 30 is being moved upwardly, the motor 44 is once more energized, returning the entire carriage 33 to the home position shown in FIG. 1, thus completing the operation.

On some occasions, it is desirable to transfer wafers from a quartz boat to the plastic cassette. For this operation, it is only necessary to move the control selector switch 118 to the "quartz to plastic mode", which will cause the apparatus to function automatically to, in effect, reverse the operation described above. That is, the carriage 33 will move so that the lifter assembly is above the quartz boat, the lifter assembly 30 will descend, open and close and lift the batch of wafers from the quartz boat, the carriage will be returned laterally wherein the lifter assembly is aligned with the plastic cassette. The lifter assembly will then be lowered, and the pusher assembly moved upwardly to receive the wafers. The jaws then open and the pusher descends, depositing the wafers gently in the plastic cassette, as the lifter assembly moves upwardly.

As mentioned above, plastic cassettes typically have slots to receive 25 wafers while quartz boats may have slots to receive 25 wafers or 50 wafers. The slots in the 50 wafer boats are spaced exactly one half the distance of the slots in the 25 wafer boat. Wafers are transferred automatically to and from a 50 wafer boat in two steps. This requires coordinating the positioning of the wafers and the lateral movement of the carriage 33. The slots 120 in the lifter jaws 78 and 79 are located in the 1, 3, 5, etc., 49 positions with respect to the gaps 122. In the first step, the operation is essentially the same as that described above except that if wafers are being transferred from a plastic cassette to the quartz boat, the first batch of wafers is placed in slots 2, 4, 6, etc., 50 of the quartz boat. The lateral movement of the carriage 33 in the 25 to 25 transfer is terminated by a stop finger 136 shown in FIG. 2, which engages an appropriate surface on the base plate lug 138. More specifically, the lug 138 engages the surface 140 on the stop finger 136. However, when the control element 119 has been actuated for the 50 wafer cassette to quartz boat mode, the controller energizes a solenoid 142. This retracts the stop finger 136 so that when the first batch of wafers is transferred to be aligned with the quartz boat, the lug 138 engages the surface 144 on the stop finger. The lateral distance between the surfaces 140 and 144 is precisely equal to the distance between adjacent slots on the 50-slot quartz boat. At the completion of the transfer of the first batch of 25 wafers, the solenoid is deenergized so that the stop finger extends and the lug 138 engages surface 140. Consequently, when the lateral movement of the second batch of wafers is stopped, the wafers are aligned with slots 1, 3, 5, etc., 49. Thus, when the lifter assembly is lowered, the second batch of wafers is interleaved between the first batch and the jaws open to release them in the desired positions.

In lowering the jaws with the second batch of wafers 18, the wafers 18a of the first batch fit in the gaps 122 in the lifter jaws 78 and 79, as seen in FIG. 11, which are located between the ribs forming the slots 120 which lift the wafers. That is, the gaps 122 do not have an inwardly extending bump 126 as in the lifting slots 120. Thus, when the jaws are being moved downwardly onto the quartz boat carrying the second batch of wafers, the jaws do not interfere with the first batch of wafers already positioned on the boat.

Similarly, if a boat of 50 wafers is to be transferred to plastic cassettes, and the jaws of the lifter assembly are lowered over the quartz boat to lift the first batch, there will be a wafer in each slot and in each gap of the jaws, but only those wafers being engaged by the inwardly extending bumps will be lifted. However, the lifting sequence and the lateral movement is reversed. That is, the carriage is first moved to be aligned with wafers 1, 3, 5, etc. in the quartz boat for the first batch and then moved to be aligned with the even numbered slots for the second batch. In other words, when all the slots of the quartz boat are filled, the slots and gaps in the lifter jaws should be aligned with the boat slots, but when only half are filled, the lifter slots and gaps can be axially offset one space. This prevents the lifter jaws from interfering with the wafers in the boat.

From the foregoing, it can be appreciated that the angled orientation of the transfer apparatus is very important. This system is specifically designed for use with quartz boats having angled, relatively wide slots. This angle is desirable for ensuring proper parallel spacing of the wafers during processing steps, while the wide slots make insertion and withdrawal of wafers easy. Nevertheless, the system may be useful with quartz boats having vertical, wide slots. In that situation, it is only necessary to employ a fixture 31 that is raised on one end so that the slots in the boat will be angled the desired amount. While the entire apparatus could be constructed without the angle, great difficulty may be encountered in attempting to pick up a batch of wafers from a plastic cassette or a quartz boat in which the various wafers are not arranged fairly precisely in spaced, parallel relation; and with horizontally oriented boats and cassettes having vertical slots, the wafers will tilt randomly. Also, if the slots are narrowed to minimize the tilting problem, inserting and withdrawal are more difficult.

What is claimed is:

1. Apparatus for transferring a batch of thin, disk-like elements, such as semiconductor wafers, from one slotted carrier to another, wherein the flat faces of the wafers are leaning at a slight angle with respect to vertical so as to insure that they are precisely arranged in spaced parallel relation, comprising:
   a support surface for supporting a first slotted carrier carrying a batch of wafers arranged in edgewise, parallel, coaxial relation;
   a lifter assembly located above said surface so that it may be positioned above said carrier for enclosing the wafers and for raising and lowering the wafers at said angle;
   means for transferring the lifter assembly laterally so that the batch of wafers may be lowered by the lifter assembly into the slots of a second carrier and released; and
   structure means for supporting the lifter assembly in a manner such that it is movable upwardly and downwardly at said angle so that the batch of wafers is inserted or withdrawn to and from the carriers in a direction parallel to the orientation of that angle.

2. The apparatus of claim 1 wherein said lifter assembly includes:
   a frame;
   a pair of spaced elongated jaws pivotally mounted on the frame and movable into open or closed position, said jaws having a series of spaced slots for receiving the edges of a series of semiconductor wafers arranged in spaced parallel relation, said jaws, when in the open position, being able to receive the maximum diameter of the wafers and in the closed position the jaw spacing being less than the maximum diameter such that the wafers may be lifted when the jaws are closed and then moved upwardly.

3. The apparatus of claim 2 including means for automatically pivoting the jaws into the open and closed positions including spring means urging the jaws into closed position and motor means for moving the jaws into open position against the urging of the spring means.

4. The apparatus of claim 2 wherein said frame has a pair of spaced side members between which said jaws extend, the jaws being mounted on pivot shafts that extend through said side members, a link fixed to each of said shafts so that moving the links will pivot the jaws into the open and closed positions, said links extending towards each other with their adjacent ends in overlapping relation, means connecting the overlapping ends to cause them to move together while they pivot about their shaft mountings, means connected to said links, said motor and said spring, for transmitting jaw opening and closing forces to said links.

5. Apparatus of claim 4 wherein said links are arranged such that they are locked into the jaw closed position in a manner which requires the links to be driven by said motor out of said locked closed position into said opened position.

6. The apparatus of claim 1 wherein:
said lifter assembly includes slotted lifter means for lifting a batch of wafers from a slotted carrier; and
said means for moving the lifter assembly laterally includes means for stopping the lifter assembly at first and second lateral positions so that a first batch of wafers can be lowered into the second carrier in first position and a second batch of wafers can be lowered into the second carrier at said second position with said second batch of wafers being interleaved with the first batch of wafers.

7. The apparatus of claim 6 wherein said lifter assembly includes a pair of jaws having a plurality of ribs defining a series of equally spaced, alternately arranged wafer lifter slots and wafer gaps, said first carrier has a plurality of slots spaced equally with the lifter slots, and said second carrier has a plurality of slots spaced equally with the lifter slots and gaps.

8. The apparatus of claim 7 wherein the lifter slots include projection means extending inwardly to provide a lifting surface for the wafers, and said gaps are dimensioned to not engage the wafers.

9. Apparatus for transferring a batch of thin, disk-like elements, such as semiconductor wafers, from one slotted carrier to another, comprising:
a support surface having an opening therethrough for supporting a batch of wafers arranged in edgewise, parallel, coaxial relation overlying said opening, wherein the flat faces of the wafers are leaning at a slight angle with respect to vertical so as to insure that they are precisely arranged in spaced parallel relation;
a lifter assembly located above said surface so that it may be positioned above said carrier for enclosing the wafers and for raising and lowering the wafers;
means for transferring the lifter assembly laterally so that the batch of wafers may be lowered by the lifter assembly into the slots of a second carrier and released; and including
means for supporting the lifter assembly and pusher assembly in a manner such that they are moved upwardly and downwardly at said angle so that the batch of wafers is inserted or withdrawn to and from the carriers in a direction parallel to the orientation of that angle.

10. The apparatus of claim 4, including means for controlling the pusher assembly, the lifter assembly, and the lateral transfer means so that the batch of wafers is transferred automatically from said first carrier to said second carrier.

11. Apparatus for transferring a batch of thin, disk-like elements, such as semiconductor wafers, from one slotted carrier to another, comprising:
a support surface having an opening therethrough for supporting a batch of wafers arranged in edgewise, parallel, coaxial relation overlying said opening;
a lifter assembly located above said surface so that it may be positioned above said carrier for enclosing the wafers and for raising and lowering the wafers;
means for transferring the lifter assembly laterally so that the batch of wafers may be lowered by the lifter assembly into the slots of a second carrier and released;
a pusher assembly located below the support surface, including means which is movable upwardly through the opening in the support surface and through a slot in the bottom of the carrier to engage the bottom edges of the wafers and to push the wafers upwardly; and
a carriage mounted for lateral movement, means on said carriage for supporting said pusher assembly for upward and downward movement, and means on said carriage for supporting the lifter assembly for up and down movement, said means for transferring the lifter assembly laterally being the means for transferring the carriage laterally.

12. A method of transferring a batch of spaced parallel semiconductor wafers from one slotted carrier to a second slotted carrier, comprising:
positioning the carriers in side by side relation;
lowering a lifting assembly over the carrier filled with wafers;
engaging and lifting the batch of wafers upwardly out of the first carrier;
moving the batch of wafers laterally to be aligned above the slots of the second carrier;
lowering the batch of wafers into the slots of the second carrier;
releasing the wafers; and
including the step of tilting the first carrier slightly so that the wafers in the carrier all lean in the same direction at a slight angle with respect to vertical wherein said lowering and lifting steps are done at said angle.

13. The method of claim 12 including pushing the wafers in the first carrier upwardly from below the carrier before attempting to lift the wafers from above the carrier.

14. The method of claim 12 including the steps of receiving the wafers in said second carrier in a pusher assembly that extends upwardly through the bottom of the second carrier, and then lowering the batch of wafers into the slots of the second carrier.

15. The method of claim 12 wherein the wafers can be transferred from the first carrier to the second carrier or the second carrier to the first, and including the step of pushing the wafers upwardly from below the first carrier before attempting to lift the wafers, or utilizing the pusher to receive and lower the batch of wafers in transferring the wafers from the second carrier to the first.

16. The method of claim 15 wherein the first carrier has a plurality of vertically extending slots for receiving wafers and the second carrier has a plurality of slots for receiving wafers and arranged so that all the wafers lean at said angle and have their axes extending horizontally and including the initial step of tilting the first carrier so that the wafers of the first carrier all lean at said same angle.

17. The method of claim 16 wherein said pushing step changes the axes of the wafers to horizontal as the wafers are pushed out of said first carrier.

* * * * *